United States Patent
Lin et al.

(10) Patent No.: US 9,042,171 B2
(45) Date of Patent: *May 26, 2015

(54) INTEGRATED CIRCUIT INCLUDING A VOLTAGE DIVIDER AND METHODS OF OPERATING THE SAME

(71) Applicant: TAIWAN SEMICONDUCTOR MANUFACTURING COMPANY, LTD., Hsinchu (TW)

(72) Inventors: Yvonne Lin, Saratoga, CA (US); Wen-Ting Chu, Kaohsiung County (TW)

(73) Assignee: TAIWAN SEMICONDUCTOR MANUFACTURING COMPANY, LTD. (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/315,415

(22) Filed: Jun. 26, 2014

(65) Prior Publication Data

US 2014/0307510 A1    Oct. 16, 2014

Related U.S. Application Data

(63) Continuation of application No. 13/241,932, filed on Sep. 23, 2011, now Pat. No. 8,780,628.

(51) Int. Cl.
| | |
|---|---|
| *G11C 11/34* | (2006.01) |
| *H01L 27/115* | (2006.01) |
| *H01L 29/94* | (2006.01) |
| *H01L 49/02* | (2006.01) |
| *G11C 16/08* | (2006.01) |
| *G11C 29/00* | (2006.01) |
| *H01L 27/06* | (2006.01) |
| *G11C 16/04* | (2006.01) |
| *H01L 27/08* | (2006.01) |

(52) U.S. Cl.
CPC .......... *H01L 27/11526* (2013.01); *H01L 29/94* (2013.01); *H01L 27/0802* (2013.01); *H01L 28/60* (2013.01); *G11C 16/08* (2013.01); *G11C 29/82* (2013.01); *H01L 27/0629* (2013.01); *G11C 16/0408* (2013.01)

(58) Field of Classification Search
USPC .................................................... 365/185.05
See application file for complete search history.

(56) References Cited

U.S. PATENT DOCUMENTS

| | | | |
|---|---|---|---|
| 3,758,794 A * | 9/1973 | Kosonocky | 377/63 |
| 5,604,696 A * | 2/1997 | Takaishi | 365/149 |
| 8,780,628 B2 * | 7/2014 | Lin et al. | 365/185.05 |
| 2001/0022528 A1 * | 9/2001 | Houghton et al. | 327/543 |
| 2006/0033138 A1 * | 2/2006 | Fukada | 257/296 |
| 2006/0114739 A1 * | 6/2006 | Worley et al. | 365/230.06 |

(Continued)

*Primary Examiner* — Hoai V Ho
*Assistant Examiner* — Pablo Huerta
(74) *Attorney, Agent, or Firm* — Lowe Hauptman & Ham, LLP

(57) ABSTRACT

An integrated circuit includes at least one memory array and at least one capacitor array over a substrate. The at least one capacitor array includes a plurality of capacitor cell structures. The capacitor cell structures of the plurality of cell structures comprise a first capacitor electrode over the substrate. A second capacitor electrode is over the first capacitor electrode. A third capacitor electrode is adjacent to first sidewalls of the first and second capacitor electrodes. A fourth capacitor electrode is adjacent to second sidewalls of the first and second capacitor electrodes. A fifth capacitor electrode is over the substrate and adjacent to the fourth capacitor electrode.

20 Claims, 4 Drawing Sheets

(56) References Cited

U.S. PATENT DOCUMENTS

| | | | |
|---|---|---|---|
| 2006/0208977 A1* | 9/2006 | Kimura | 345/76 |
| 2007/0079488 A1* | 4/2007 | Kim et al. | 29/25.01 |
| 2008/0121954 A1* | 5/2008 | Shuto | 257/295 |
| 2009/0315144 A1* | 12/2009 | Wang | 257/532 |
| 2010/0001760 A1* | 1/2010 | Balasubramanian et al. | 326/38 |
| 2010/0008141 A1* | 1/2010 | Chu et al. | 365/185.05 |
| 2010/0320566 A1* | 12/2010 | Manning et al. | 257/532 |
| 2011/0006355 A1* | 1/2011 | Shen et al. | 257/316 |

* cited by examiner

INTEGRATED CIRCUIT INCLUDING A VOLTAGE DIVIDER AND METHODS OF OPERATING THE SAME

PRIORITY CLAIM

The present application is a continuation of U.S. application Ser. No. 13/241,932, filed Sep. 23, 2011, which is incorporated by reference herein in its entirety.

TECHNICAL FIELD

The present disclosure relates generally to the field of semiconductor devices and, more particularly, to integrated circuits including a voltage divider and methods of operating the same.

BACKGROUND

The market share of complementary metal-oxide-semiconductor (CMOS) memory devices has been continuously growing, especially in view of the development of FLASH memory in which a single cell can be electrically programmable and a block, sector, or page of the cells may be simultaneously electrically erasable. In recent years, FLASH memory has found interesting applications in consumer products such as digital cameras, digital video cameras, cellular telephones, laptop computers, and personal digital assistants. Because portability of consumer products is often a prerequisite by consumers, a reduction in the size of the consumer products continues to be a goal. As a result, the functionality and capacity of the FLASH memory should be augmented, while, at the same time, maintaining or, preferably, reducing the footprint of the FLASH memory.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
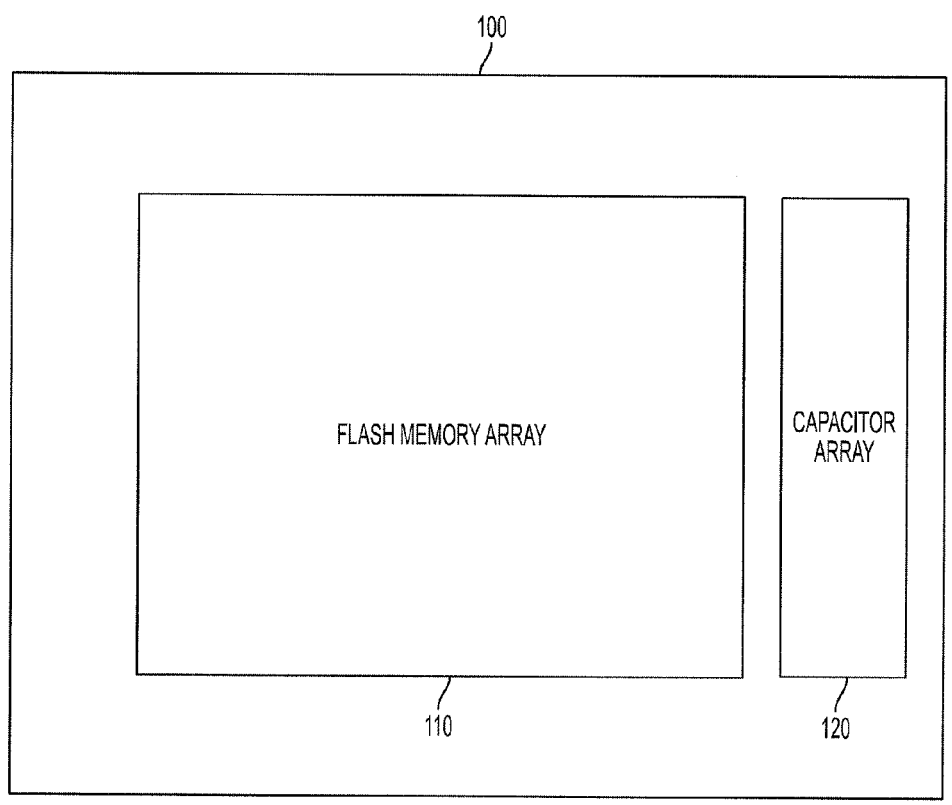
FIG. 1 is a schematic drawing illustrating an exemplary integrated circuit.

Currently, a voltage divider is placed in a mixed-signal circuit that is disposed around a FLASH memory array for providing a reference voltage. A simple example of a voltage divider consists of two capacitors that are electrically coupled in series. Each capacitor consists of a single top capacitor plate and a single bottom capacitor plate. As the structure of the capacitors is so different from the FLASH cell structure, the capacitors of the voltage divider and the FLASH memory array are formed by separate processing stages during manufacturing. Additionally, a certain area of the FLASH memory circuit is designated for the capacitors.

To increase the capacitance of the capacitor, the top and bottom capacitor plates are made of metallic materials. The capacitors are referred to as metal-insulator-metal (MIM) capacitors. Applicants found that due to the quality of the dielectric insulator, charges stored in the capacitors easily leak.

It is understood that the following descriptions provide many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Illustrated in FIG. 1 is a schematic drawing showing an exemplary integrated circuit. In FIG. 1, an integrated circuit 100 includes at least one FLASH memory array, e.g., a FLASH memory array 110 and at least one capacitor array, e.g., a capacitor array 120. The FLASH memory array 110 is configured to store data information. The capacitor array 120 is configured to store electric charge. It is noted that though merely showing a single FLASH memory array and a single capacitor array in FIG. 1, the scope of this application is not limited thereto. In some embodiments, two or more FLASH memory arrays and/or capacitor arrays can be used. It is also noted that the capacitor array 120 may include tens to hundreds of thousands of capacitor cell structures that are electrically coupled to each in series and/or in a parallel fashion.

Figure 2A:
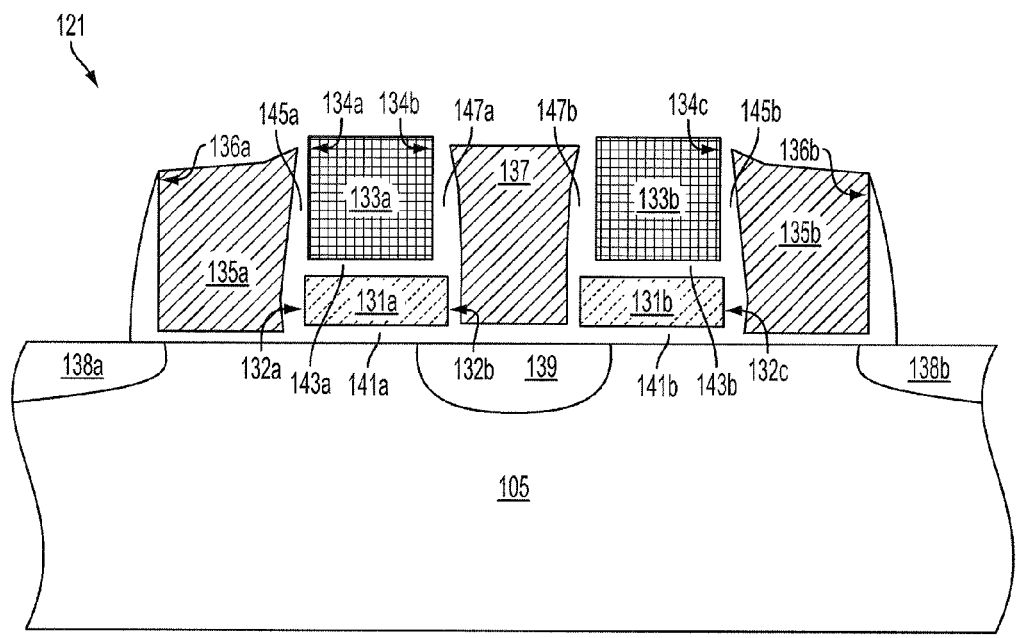
FIG. 2A is a schematic cross-sectional view of an exemplary capacitor cell structure.

FIG. 2A is a schematic cross-sectional view of an exemplary capacitor cell structure 121 disposed over a substrate. As noted, the capacitor array 120 (shown in FIG. 1) includes a plurality of capacitor cell structures. In some embodiments, a capacitor cell structure 121 includes a plurality of capacitor electrodes. For example, the capacitor cell structure 121 includes a capacitor electrode 131a that is disposed over a substrate 105. A capacitor electrode 133a is disposed over the capacitor electrode 131a. A capacitor electrode 135a is disposed adjacent to sidewalls 132a and 134a of the capacitor electrodes 131a and 133a, respectively. A capacitor electrode 137 is disposed adjacent to sidewalls 132b and 134b of the capacitor electrodes 131a and 133a, respectively. The capacitor electrodes 131a, 133a, 135a and 137 are each selectively coupled with a voltage level or an output node of a voltage divider.

In some embodiments, the substrate 105 is a silicon substrate doped with a P-type dopant, such as boron (a P-type substrate). Alternatively, the substrate 105 is another suitable semiconductor material. For example, the substrate 105 is a silicon substrate that is doped with an N-type dopant, such as phosphorous or arsenic (an N-type substrate). The substrate 105 may alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrate 105 could include an epitaxial layer (epi layer), may be strained for performance enhancement, and may include a silicon-on-insulator (SOI) structure.

In some embodiments, the capacitor electrodes 131a, 133a, 135a, and 137 are each made of at least one conductive material, such as crystalline silicon, polysilicon, amorphous silicon, aluminum, copper, titanium (Ti), titanium nitride (TiN), tantalum nitride (TaN), tantalum (Ta), tantalum carbide (TaC), tantalum silicon nitride (TaSiN), tungsten (W), tungsten nitride (WN), molybdenum nitride (MoN), molybdenum oxynitride (MoON), ruthenium oxide ($RuO_2$), other conductive materials and/or any combinations thereof. In some embodiments, the capacitor electrodes 131a, 133a, 135a and 137 are formed by any suitable process, such as an atomic layer deposition (ALD) process, a chemical vapor deposition (CVD) process, a physical vapor deposition (PVD) process, a reduced-pressure CVD (RPCVD) process, a plasma-enhanced CVD (PECVD) process, a metal organic CVD (MOCVD) process, a plating process, a sputtering process, or any combinations thereof.

In some embodiments, the capacitor cell structure 121 has a symmetric structure. For example, the capacitor cell structure 121 includes additional capacitor electrodes 131b, 133b, and 135b that are symmetric to the capacitor electrodes 131a, 133a and 135a with respect to the central line of the capacitor electrode 137 as shown in FIG. 2A. In at least the embodiment, the capacitor cell structure 121 includes two symmetric capacitor cells. The capacitor electrode 131b is disposed over the substrate 105 and adjacent to the capacitor electrode 137. The capacitor electrode 133b is disposed over the capacitor electrode 131b and adjacent to the capacitor electrode 137. The capacitor electrode 135b is disposed over the substrate 105 and adjacent to sidewalls 132c and 134c of the capacitor electrodes 131b and 133b, respectively. In some embodiments, the capacitor electrodes 131b, 133b and 135b are made of the materials that are the same as or similar to those of the capacitor electrodes 131a, 133a and 135a, respectively.

In some embodiments, the capacitor cell structure 121 optionally includes capacitor electrodes 138a, 138b, and 139 that are disposed in the substrate 105. The capacitor electrode 138a and 138b are adjacent to sidewalls 136a and 136b of the capacitor electrodes 135a and 135b, respectively. The capacitor electrode 139 is disposed below the capacitor electrode 137. In some embodiments, the capacitor electrodes 138a-138b and 139 are doped regions in the substrate 105. The doped regions include N-type or P-type dopants. As noted, the formation of the capacitor electrodes 138a-138b and 139 is optional. In some embodiments, the capacitor electrodes 138a-138b and 139 are not used. The capacitor cell structure 121 is formed over an isolation feature, e.g., a shallow trench isolation (STI) feature (not shown).

Referring again to FIG. 2A, capacitor dielectric structures 141a and 141b are disposed between the respective capacitor electrodes 131a-131b and the substrate 105. Capacitor dielectric structures 143a and 143b are disposed between the capacitor electrodes 131a and 133a and between the capacitor electrodes 131b and 133b, respectively. A capacitor dielectric structure 145a is disposed between the capacitor electrodes 131a, 133a and 135a. A capacitor dielectric structure 145b is disposed between the capacitor electrodes 131b, 133b and 135b. A capacitor dielectric structure 147a is disposed between the capacitor electrodes 131a, 133a and 137.

A capacitor dielectric structure 147b is disposed between the capacitor electrodes 131b, 133b and 147.

In some embodiments, the capacitor dielectric structures 141a-141b, 143a-143b, 145a-145b, and 147a-147b each are made of at least one dielectric material, e.g., silicon oxide, silicon nitride, silicon oxynitride, silicon carbide, silicon oxycarbide, silicon carbon nitride, other dielectric materials, and/or any combinations thereof. In some embodiments, the capacitor dielectric structures 141a-141b, 143a-143b, 145a-145b, and 147a-147b each include a single dielectric layer or a multi-layer structure.

In some embodiments, the capacitor dielectric structures 141a and 143a are different. For example, the capacitor dielectric structure 141a includes a silicon oxide layer. The silicon oxide layer is made by a thermal oxidation process and/or a CVD process. The capacitor dielectric structure 143a includes a silicon oxide/silicon nitride (ON) structure. In other embodiments, the capacitor dielectric structure 143a includes a silicon oxide/silicon nitride/silicon oxide (ONO) structure.

In some embodiments, the capacitor dielectric structures 141a and 145a are different. The capacitor dielectric structures 141a and 145a each comprise a silicon oxide layer. The silicon oxide layer of the capacitor dielectric structure 141a may have a quality that is the same or similar to a gate dielectric oxide layer of a transistor. The silicon oxide layer of the capacitor dielectric structure 145a may be formed by a suitable thermal oxidation process. The oxide quality of the capacitor dielectric structure 141a is superior to that of the capacitor dielectric structure 145a.

Referring again to FIG. 2A, the capacitor cell structure 121 includes a plurality of capacitors. For example, each pair of the capacitor electrodes 131a and 133a, 131a and 135a, 131a and 137, 133a and 135a, 133a and 137, 131b and 133b, 131b and 135b, 131b and 137, 133b and 135b, 133b and 137, and 137 and 139 are operable as a capacitor. Applicants find that the capacitance between any two neighboring capacitor electrodes of the capacitor electrodes 131a-131b, 133a-133b, 135a-135b, and 137, e.g., the capacitor electrodes 131a and 133a, has a linear characteristic. The capacitance between, for example, the capacitor electrodes 137 and 139 is non-linear. The non-linear capacitances increase the total capacitance of the capacitor cell structure 121 and may affect the linearity of the total capacitance of the capacitor cell structure 121.

Figure 2B:
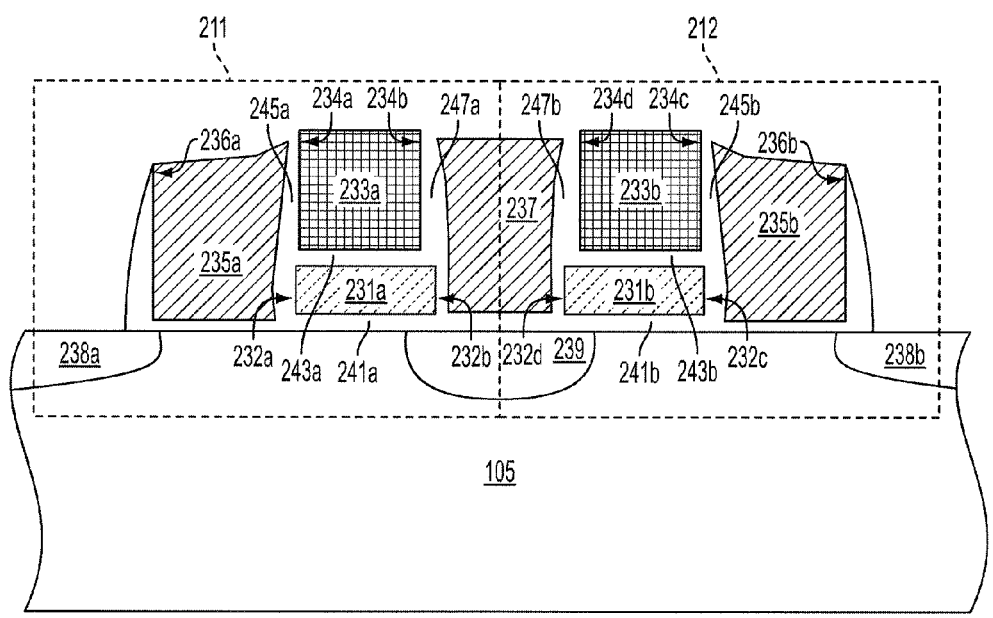
FIG. 2B is a schematic cross-sectional view of exemplary FLASH memory cells.

FIG. 2B is a schematic cross-sectional view of exemplary FLASH memory cells. In FIG. 2B, the FLASH memory cells 211 and 212 include floating gates 231a and 231b, respectively, over the substrate 105. The floating gates 231a and 231b are not electrically coupled to any power voltage. The FLASH memory cells 211 and 212 include control gates 233a and 233b that are disposed over the floating gates 231a and 231b, respectively. Word lines 235a and 235b are disposed adjacent to sidewalls 234a and 234c of the control gates 233a and 233b, respectively. An erase gate 237 is disposed adjacent to sidewalls 234b and 234d of the control gates 233a and 233b, respectively. In some embodiments, the erase gate 237 is referred to as a common erase gate. In some embodiments, the floating gates 231a-231b, the control gates 233a-233b, the word lines 235a-235b, and the erase gate 237 are made of the materials that are the same as the electrodes 131a-131b, 133a-133b, 135a-135b, and 137, respectively, described above in conjunction with FIG. 2A.

Referring to FIG. 2B, source/drain (S/D) regions 238a and 238b are disposed in the substrate 105 and adjacent to sidewalls 236a and 236b of the word lines 235a and 235b, respectively. In some embodiments, the S/D regions 238a and 238b are referred to as bit lines. An S/D region 139 is disposed in the substrate 105 and adjacent to sidewalls 232b and 232d of the floating gates 231a and 231b, respectively. In some embodiments, the S/D region 239 is referred to as a common S/D region. In some embodiments, the S/D regions 238a-238b and 239 have dopant concentrations that are the same as or similar to those of the capacitor electrodes 138a-138b and 139, respectively, described above in conjunction with FIG. 2A.

Referring to FIG. 2B, dielectric structures 241a and 241b are disposed below the floating gates 241a-241b, respectively. In some embodiments, the dielectric structures 241a and 241b are referred to as tunnel dielectric structures. Dielectric structure 243a and 243b are disposed between the respective floating gates 231a-231b and the control gates 233a-233b. In some embodiments, the dielectric structures 243a and 243b are referred to as inter-poly dielectric structures. Dielectric structures 245a and 247a are disposed around the floating gate 231a and the control gate 233a so as to electrically isolate the word line 235a and the erase gate 237 from the floating gate 231a and the control gate 233a. Dielectric structures 245b and 247b are disposed around the floating gate 231b and the control gate 233b so as to electrically isolate the word line 235b and the erase gate 237 from the floating gate 231b and the control gate 233b. In some embodiments, the dielectric structures 241a-241b, 243a-243b, 245a-245b, and 247a-247b are made of the materials that are the same as or similar to those of the capacitor dielectric structures 141a-141b, 143a-143b, 145a-145b, and 147a-147b, respectively, as described above in conjunction with FIG. 2A.

In some embodiments programming the FLASH memory cell 211, a voltage level $V_{C1}$ is applied to the control gate 233a. A voltage level $V_{W1}$ is applied to the word line 235a. The voltage level $V_{W1}$ is lower than the voltage level $V_{C1}$. A voltage level $V_{BL1}$ is applied to the S/D region 238a. A voltage level $V_{CS1}$ is applied to the S/D region 239. The voltage level $V_{CS1}$ is higher than the voltage level $V_{BL1}$. The erase gate 237 is electrically floating or ground.

In some embodiments programming the FLASH memory cell 211, the voltage level $V_{CS1}$ is higher than the voltage level $V_{W1}$ and lower than the voltage level $V_{C1}$. The voltage level $V_{BL1}$ is lower than the voltage level $V_{W1}$. In some embodiments, the voltage level $V_{W1}$ is about 1.3±0.1 V, the voltage level $V_{BL1}$ is around 0.8±0.1 V, the voltage level $V_{C1}$ is around 12±1.2 V, and the voltage level $V_{CS1}$ is around 5±0.5 V. It is noted that the voltage levels described above are merely exemplary. Different voltage levels can be applied to the FLASH memory cells depending on, for example, technology nodes.

In some embodiments reading the FLASH memory cell 211, a voltage level $V_{C2}$ is applied to the control gate 233a. A voltage level $V_{W2}$ is applied to the word line 235a. A voltage level $V_{BL2}$ is applied to the S/D region 238a. A voltage level $V_{CS2}$ is applied to the S/D region 239. The erase gate 137 is electrically floating or ground.

In some embodiments reading the FLASH memory cell 211, the voltage level $V_{C2}$ is substantially equal to the voltage level $V_{W2}$. The voltage level $V_{BL2}$ is higher than the voltage level $V_{CS2}$. In some embodiments, the voltage level $V_{C2}$ is higher than the voltage level $V_{BL2}$. In some embodiments, the voltage level $V_{W2}$ is about 2.5±0.25 V, the voltage level $V_{BL2}$ is around 0.8±0.08 V, the voltage level $V_{C2}$ is around 2.5±0.25 V, and the voltage level $V_{CS2}$ is around 0 V. It is noted that the voltage levels described above are merely exemplary. Different voltage levels can be applied to the FLASH memory cells depending on, for example, technology nodes.

In some embodiments erasing the FLASH memory cell 211, a voltage level $V_{C3}$ is applied to the control gate 233a. A voltage level $V_{W3}$ is applied to the word line 235a. A voltage level $V_{BL3}$ is applied to the S/D region 238a. A voltage level $V_{CS3}$ is applied to the S/D region 239. A voltage level $V_E$ is applied to the erase gate 237. In some embodiments, the voltage level $V_E$ is higher than each of the voltage levels $V_{C3}$, $V_{W3}$, $V_{BL3}$ and $V_{CS3}$. In some embodiments, the voltage level $V_{WL3}$ is about 0 V, the voltage level $V_{BL3}$ is about 0 V, the voltage level $V_{C3}$ is around 0 V, the voltage level $V_{CS3}$ is around 0 V, and the voltage level $V_E$ is around 12.5±1.25 V. It is noted that the voltage levels described above are merely exemplary. Different voltage levels can be applied to the FLASH memory cells depending on, for example, technology nodes.

Referring to FIGS. 2A-2B, the combined structure of the memory cells 211 and 212 is similar to the structure of the capacitor cell structure 121. That is, the process of forming the memory cells 211 and 212 also forms the capacitor cell structure 121. In some embodiments, the capacitor array 120 is a specifically designed capacitor cell array, which is not converted from a redundancy FLASH memory array or a dummy FLASH memory array. In other embodiments, the capacitor array 120 is a redundancy FLASH memory array that is not used for repairing columns and/or rows of memory cells in the FLASH memory array 110. In still other embodiments, the capacitor array 120 is a dummy FLASH memory array that is used for reducing process loading effects in various stages. By converting the unused redundancy FLASH memory array or the dummy FLASH memory array to the capacitor array 120, the area for designing capacitors of a mixed-signal circuit is saved.

As noted, the capacitor cell 121 and the memory cells 211 and 212 can be formed by the same process. The strength and reliability of the capacitor cell 121 are the same as those of the memory cells 211 and 212. As noted, the memory cells 211 and 212 are configured to sustain operation under a high voltage level, e.g., 12 V. Having the similar materials and structures of the memory cells 211 and 212, the capacitor cell structure 121 can sustain the high voltage applied to the capacitor electrodes. The breakdown voltages of the dielectric structures 141a-141b, 143a-143b, 145a-145b, and/or 147a-147b of the capacitor cell 121 can reach about 10 V or more.

Figure 3:
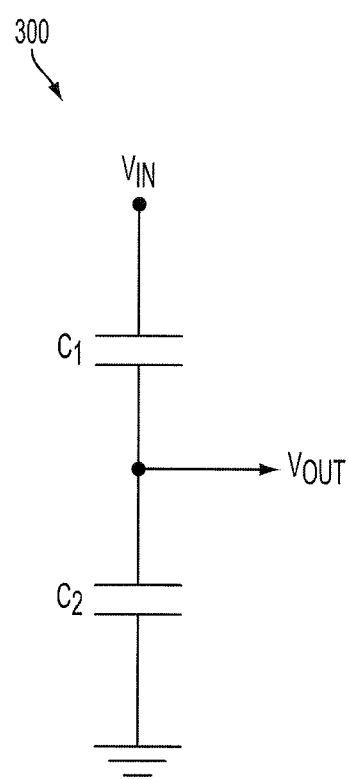
FIG. 3 is a schematic drawing of an exemplary voltage divider.

In some embodiments, the capacitor cell 121 is operable as a voltage divider. FIG. 3 is a schematic drawing of an exemplary voltage divider. In FIG. 3, a voltage divider 300 includes two capacitors $C_1$ and $C_2$ that are electrically coupled in series. By applying a voltage level $V_{IN}$ on a terminal of the capacitor $C_1$, the voltage level $V_{OUT}$ on the output node of the voltage divider 300 is shown as below:

$$V_{OUT} = \frac{C_1}{C_1 + C_2} \times V_{IN}$$

In some embodiments, the capacitor electrode 133a is electrically coupled with the voltage level $V_{IN}$. The capacitor electrode 133b is electrically grounded. The capacitor electrodes 131a, 131b, and 137 are electrically coupled to each other and to the output node of the voltage divider 300. The voltage level $V_{OUT}$ on the output node of the voltage divider 300 is smaller than the voltage level $V_{IN}$.

In other embodiments, the capacitor electrodes 131a and 133a are electrically coupled to the voltage level $V_{IN}$. The capacitor electrodes 131b and 133b are electrically grounded.

The capacitor electrode 137 is electrically coupled to the output node of the voltage divider 300. The voltage level $V_{OUT}$ on the output node of the voltage divider 300 is smaller than the voltage level $V_{IN}$.

In still other embodiments, the capacitor electrode 131a is electrically coupled to the voltage level $V_{IN}$. The capacitor electrode 131b is electrically grounded. The capacitor electrodes 133a, 133b, and 137 are electrically coupled to each other and to the output node of the voltage divider 300. The voltage level $V_{OUT}$ on the output node of the voltage divider 300 is smaller than the voltage level $V_{IN}$.

An aspect of this description relates to an integrated circuit that includes at least one memory array and at least one capacitor array over a substrate. The at least one capacitor array includes a plurality of capacitor cell structures. The capacitor cell structures of the plurality of cell structures comprise a first capacitor electrode over the substrate. A second capacitor electrode is over the first capacitor electrode. A third capacitor electrode is adjacent to first sidewalls of the first and second capacitor electrodes. A fourth capacitor electrode is adjacent to second sidewalls of the first and second capacitor electrodes. A fifth capacitor electrode is over the substrate and adjacent to the fourth capacitor electrode.

Another aspect of this description relates to an integrated circuit that comprises at least one memory array over a substrate. The at least one memory array comprises a plurality of memory cells. The memory cells of the plurality of memory cells comprise a floating gate over the substrate; a control gate over the floating gate; a word line adjacent to first sidewalls of the floating gate and the control gate; an erase gate adjacent to second sidewalls of the floating gate and the control gate; a first source/drain (S/D) region in the substrate and adjacent to a sidewall of the word line; and a second S/D region in the substrate and below the erase gate. The integrated circuit also comprises at least one capacitor array that includes a plurality of capacitor cell structures over the substrate. The capacitor cell structures of the plurality of capacitor cell structures comprise a first capacitor electrode over the substrate; a second capacitor electrode over the first capacitor electrode; a third capacitor electrode adjacent to first sidewalls of the first and second capacitor electrodes; a fourth capacitor electrode adjacent to second sidewalls of the first and second capacitor electrodes; and a fifth capacitor electrode over the substrate and adjacent to the fourth capacitor electrode.

A further aspect of this description relates to method of operating a voltage divider. The voltage divider comprises a plurality of capacitor cell structures over a substrate. The capacitor cell structures of the plurality of cell capacitor structures comprise a first capacitor electrode over the substrate, a second capacitor electrode over the first capacitor electrode, a third capacitor electrode adjacent to first sidewalls of the first and second capacitor electrodes, a fourth capacitor electrode adjacent to second sidewalls of the first and second capacitor electrodes, and a fifth capacitor electrode over the substrate and adjacent to the fourth capacitor electrode. The method comprises applying a first voltage level to at least a first one of the first to fifth capacitor electrodes; electrically grounding at least a second one of the first to fifth capacitor electrodes; and electrically coupling at least a third one of the first to fifth capacitor electrodes to provide a second voltage level on an output node of the voltage divider.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   at least one memory array over a substrate; and
   at least one capacitor array including a plurality of capacitor cell structures over the substrate, the capacitor cell structures of the plurality of cell structures comprising:
   a first capacitor electrode over the substrate;
   a second capacitor electrode over the first capacitor electrode;
   a third capacitor electrode adjacent to first sidewalls of the first and second capacitor electrodes;
   a fourth capacitor electrode adjacent to second sidewalls of the first and second capacitor electrodes; and
   a fifth capacitor electrode over the substrate and adjacent to the fourth capacitor electrode.

2. The integrated circuit of claim 1, wherein the capacitor cell structures further comprise:
   a sixth capacitor electrode over the fifth capacitor electrode and adjacent to the fourth capacitor electrode; and
   a seventh capacitor electrode over the substrate and adjacent to sidewalls of the fifth and sixth capacitor electrodes.

3. The integrated circuit of claim 2, wherein
   the second capacitor electrode is configured to receive a first voltage level;
   the sixth capacitor electrode is electrically grounded; and
   the first, fourth and fifth capacitor electrodes are electrically coupled to each other and are configured to provide a second voltage level that is smaller than the first voltage level.

4. The integrated circuit of claim 2, wherein
   the first and second capacitor electrodes are configured to receive a first voltage level;
   the fifth and sixth capacitor electrodes are electrically grounded; and
   the fourth capacitor electrode is configured to provide a second voltage level that is smaller than the first voltage level.

5. The integrated circuit of claim 2, wherein
   the first capacitor electrode is configured to receive a first voltage level;
   the fifth capacitor electrode is electrically grounded; and
   the second, fourth and sixth capacitor electrodes are electrically coupled to each other and are configured to provide a second voltage level that is smaller than the fifth voltage level.

6. The integrated circuit of claim 1, wherein the capacitor cell structures of the plurality of capacitor cell structures further comprise:
   a sixth capacitor electrode in the substrate and below the fourth capacitor electrode.

7. The integrated circuit of claim 6, wherein the sixth capacitor electrode comprises a doped region in the substrate.

8. The integrated circuit of claim 1, wherein the capacitor cell structures of the plurality of capacitor cell structures further comprise:
   a first capacitor dielectric structure between the substrate and the first capacitor electrode;

a second capacitor dielectric structure between the first and second capacitor electrodes, wherein the first capacitor dielectric structure is different from the second capacitor dielectric structure;

a third capacitor dielectric structure between the third capacitor electrode and the first sidewalls of the first and second capacitor electrodes; and a fourth capacitor dielectric structure between the fourth capacitor electrode and the second sidewalls of the first and second capacitor electrodes.

9. The integrated circuit of claim 8, wherein the first capacitor dielectric structure comprises a silicon oxide layer and the second capacitor dielectric structure comprises a silicon oxide/silicon nitride (ON) structure.

10. The integrated circuit of claim 1, wherein at least one memory array comprises a plurality of memory cells and the memory cells of the plurality of memory cells comprise:
a floating gate over the substrate;
a control gate over the floating gate;
a word line adjacent to first sidewalls of the floating gate and the control gate;
an erase gate adjacent to second sidewalls of the floating gate and the control gate;
a first source/drain (S/D) region in the substrate and adjacent to a sidewall of the word line; and
a second S/D region in the substrate and below the erase gate.

11. An integrated circuit comprising:
at least one memory array over a substrate, wherein the at least one memory array comprises a plurality of memory cells and the memory cells of the plurality of memory cells comprise:
a floating gate over the substrate;
a control gate over the floating gate;
a word line adjacent to first sidewalls of the floating gate and the control gate;
an erase gate adjacent to second sidewalls of the floating gate and the control gate;
a first source/drain (S/D) region in the substrate and adjacent to a sidewall of the word line; and
a second S/D region in the substrate and below the erase gate; and
at least one capacitor array including a plurality of capacitor cell structures over the substrate, the capacitor cell structures of the plurality of capacitor cell structures comprising:
a first capacitor electrode over the substrate;
a second capacitor electrode over the first capacitor electrode;
a third capacitor electrode adjacent to first sidewalls of the first and second capacitor electrodes;
a fourth capacitor electrode adjacent to second sidewalls of the first and second capacitor electrodes; and
a fifth capacitor electrode over the substrate and adjacent to the fourth capacitor electrode.

12. The integrated circuit of claim 11, wherein
the second capacitor electrode is configured to receive a first voltage level; and
the first, fourth and fifth capacitor electrodes are electrically coupled to each other and are configured to provide a second voltage level that is smaller than the first voltage level.

13. The integrated circuit of claim 11, wherein
the first and second capacitor electrodes are configured to receive a first voltage level;
the fifth capacitor electrode is electrically grounded; and
the fourth capacitor electrode is configured to provide a second voltage level that is smaller than the first voltage level.

14. The integrated circuit of claim 11, wherein
the first capacitor electrode is configured to receive a first voltage level;
the fifth capacitor electrode is electrically grounded; and
the second and fourth capacitor electrodes are electrically coupled to each other and are configured to provide a second voltage level that is smaller than the first voltage level.

15. The integrated circuit of claim 11, wherein the capacitor cell structures of the plurality of capacitor cell structures further comprise:
a sixth capacitor electrode in the substrate and adjacent to a sidewall of the third capacitor electrode; and
a seventh capacitor electrode in the substrate and below the fourth capacitor electrode, wherein the sixth and seventh capacitor electrodes comprise a doped region in the substrate.

16. The integrated circuit of claim 11, wherein the capacitor cell structures of the plurality of capacitor cell structures further comprise:
a first capacitor dielectric structure comprising a silicon oxide layer between the substrate and the first capacitor electrode;
a second capacitor dielectric structure comprising a silicon oxide/silicon nitride (ON) structure between the first and second capacitor electrodes;
a third capacitor dielectric structure between the third capacitor electrode and the first sidewalls of the first and second capacitor electrodes; and
a fourth capacitor dielectric structure between the fourth capacitor electrode and the second sidewalls of the first and second capacitor electrodes.

17. A method of operating a voltage divider, the voltage divider comprising a plurality of capacitor cell structures over a substrate, the capacitor cell structures of the plurality of cell capacitor structures comprising a first capacitor electrode over the substrate, a second capacitor electrode over the first capacitor electrode, a third capacitor electrode adjacent to first sidewalls of the first and second capacitor electrodes, a fourth capacitor electrode adjacent to second sidewalls of the first and second capacitor electrodes, and a fifth capacitor electrode over the substrate and adjacent to the fourth capacitor electrode, the method comprising:
applying a first voltage level to at least a first one of the first to fifth capacitor electrodes;
electrically grounding at least a second one of the first to fifth capacitor electrodes; and
electrically coupling at least a third one of the first to fifth capacitor electrodes to provide a second voltage level on an output node of the voltage divider.

18. The method of claim 17, wherein
the at least first one of the first to fifth capacitor electrodes comprises the second capacitor electrode; and
the at least second one of the first to fifth capacitor electrodes comprises the first, the fourth or the fifth capacitor electrodes.

19. The method of claim 17, wherein
the at least first one of the first to fifth capacitor electrodes comprises the first or the second capacitor electrodes; and
the at least third one of the first to fifth capacitor electrodes comprises the fourth capacitor electrode.

20. The method of claim 17, wherein
the at least first one of the first to fifth capacitor electrodes comprises the first capacitor electrode;
the at least second one of the first to fifth capacitor electrodes comprises the fifth capacitor electrode; and
the at least third one of the first to fifth capacitor electrodes comprises the second or the fourth capacitor electrodes.

\* \* \* \* \*